(12) United States Patent
Fujii et al.

(10) Patent No.: US 11,539,346 B2
(45) Date of Patent: Dec. 27, 2022

(54) RESONATOR DEVICE, RESONATOR MODULE, ELECTRONIC APPARATUS, AND VEHICLE

(71) Applicant: SEIKO EPSON CORPORATION, Tokyo (JP)

(72) Inventors: Masahiro Fujii, Shiojiri (JP); Ryuichi Kurosawa, Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 400 days.

(21) Appl. No.: 16/776,791

(22) Filed: Jan. 30, 2020

(65) Prior Publication Data

US 2020/0252048 A1    Aug. 6, 2020

(30) Foreign Application Priority Data

Jan. 31, 2019   (JP) .............................. JP2019-016276

(51) Int. Cl.
    *H03H 9/17*     (2006.01)
    *H03H 9/10*     (2006.01)
    *H01L 41/053*   (2006.01)

(52) U.S. Cl.
    CPC ........... *H03H 9/17* (2013.01); *H01L 41/0533* (2013.01); *H03H 9/10* (2013.01)

(58) Field of Classification Search
    CPC ...................................................... H03H 9/17
    USPC ...................................................... 310/348
    See application file for complete search history.

(56) References Cited

U.S. PATENT DOCUMENTS

| 2009/0152656 | A1  | 6/2009 | Okudo et al. |
| 2013/0063217 | A1* | 3/2013 | Sato .......................... H03H 9/10 29/829 |
| 2014/0254328 | A1* | 9/2014 | Tamura ..................... H03H 9/21 310/370 |
| 2015/0048720 | A1* | 2/2015 | Kim ..................... H01L 41/0474 29/25.35 |
| 2016/0164490 | A1  | 6/2016 | Kamijo et al. |

FOREIGN PATENT DOCUMENTS

| JP | H10-92702   | A | 4/1998  |
| JP | 2004-128591 | A | 4/2004  |
| JP | 2004-214787 | A | 7/2004  |
| JP | 2007-266318 | A | 10/2007 |
| JP | 2008-207221 | A | 9/2008  |
| JP | 2009-225220 | A | 10/2009 |
| JP | 2011-187867 | A | 9/2011  |
| JP | 2014-192653 | A | 10/2014 |

(Continued)

*Primary Examiner* — Joseph Chang
(74) *Attorney, Agent, or Firm* — Rankin, Hill & Clark LLP

(57) ABSTRACT

A resonator device includes a base, a resonator element attached to the base, a cover accommodating the resonator element between the base and the cover, and a conductive bonding member positioned between the base and the cover and bonding the base to the cover. The base includes a resonator element mount surface on which the resonator element is attached, a first interconnect and a second interconnect that are arranged on the resonator element mount surface and that are electrically coupled to the resonator element, a bonding surface bonded to the cover through the bonding member, and a step between the resonator element mount surface and the bonding surface.

10 Claims, 14 Drawing Sheets

(56) References Cited

FOREIGN PATENT DOCUMENTS

| | | |
|---|---|---|
| JP | 2015-088961 A | 5/2015 |
| JP | 2017-084941 A | 5/2017 |
| WO | 2013/076830 A1 | 5/2013 |
| WO | 2016/084425 A1 | 6/2016 |

* cited by examiner

FIG. 4
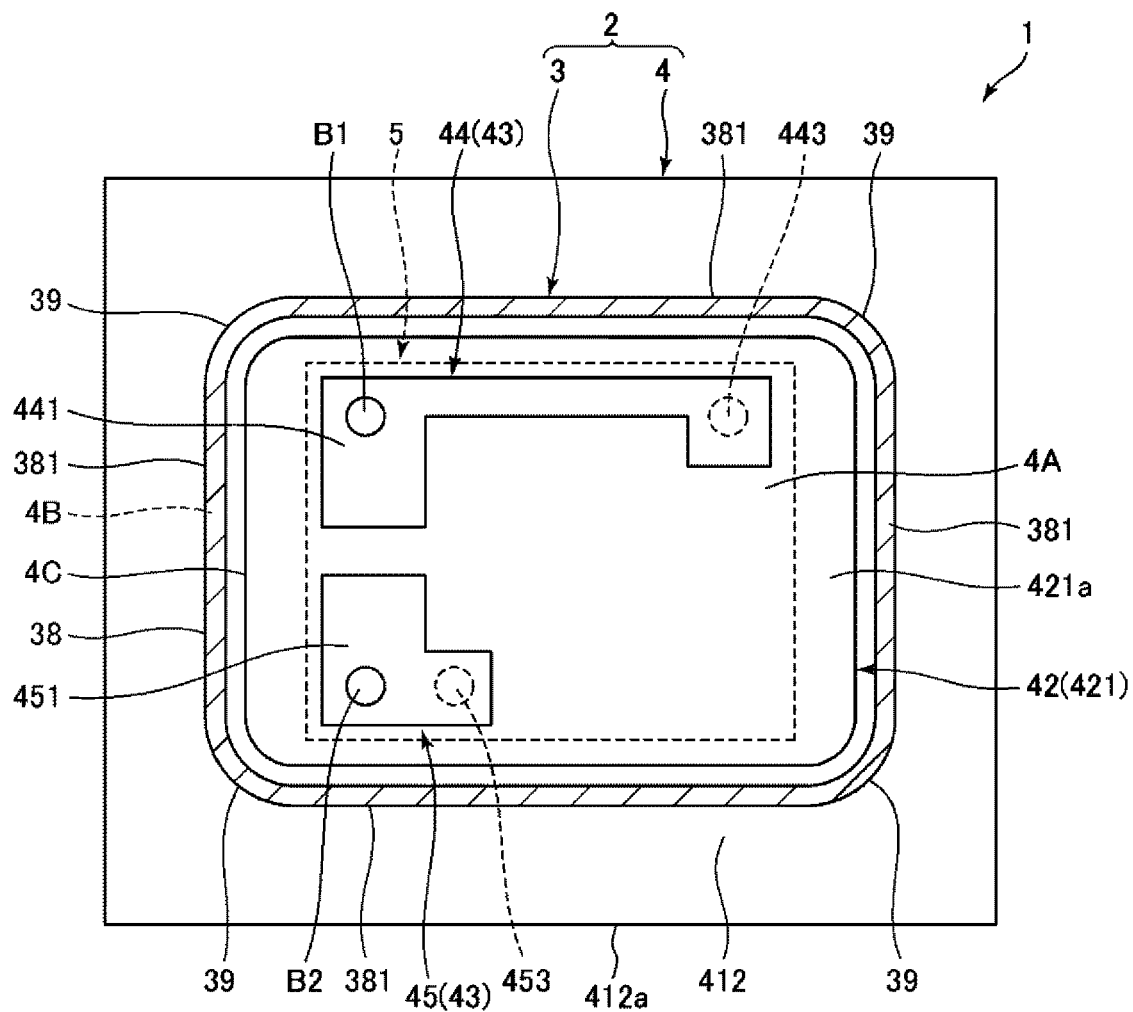
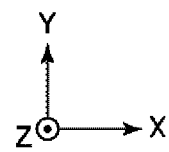

RESONATOR DEVICE, RESONATOR MODULE, ELECTRONIC APPARATUS, AND VEHICLE

The present application is based on, and claims priority from JP Application Serial Number 2019-016276, filed Jan. 31, 2019, the disclosure of which is hereby incorporated by reference herein in its entirety.

BACKGROUND

1. Technical Field

The present disclosure relates to a resonator device, a resonator module, an electronic apparatus, and a vehicle.

2. Related Art

A method of directly bonding two quartz crystal substrates, particularly, diffusion bonding using a metal film, is disclosed in JP-A-2011-187867.

However, when a substrate of which an interconnect is formed on the surface is diffusion-bonded, a metal atom that is repelled from a target is attached to an unintended location on the surface of the substrate during deposition of the bonding metal film on the substrate by sputtering or the like. The interconnect may be short-circuited by the attached object. The attachment of the metal atom to the unintended location can be reduced to a certain extent by using a mask during the sputtering. However, the metal atom may pass around the mask to a space immediately below the mask, and this problem cannot be securely prevented.

SUMMARY

A resonator device according to an aspect of an application example includes a base, a resonator element attached to the base, a cover accommodating the resonator element between the base and the cover, and a conductive bonding member bonding the base to the cover. The base includes a resonator element mount surface on which the resonator element is attached, a first interconnect and a second interconnect that are arranged on the resonator element mount surface and that are electrically coupled to the resonator element, a bonding surface bonded to the cover through the bonding member, and a step arranged between the resonator element mount surface and the bonding surface.

A resonator module according to another application example includes the resonator device.

An electronic apparatus according to another application example includes the resonator device.

A vehicle according to another application example includes the resonator device.

BRIEF DESCRIPTION OF THE DRAWINGS

FIG. 4 is a plan view of the resonator device illustrated in FIG. 1.

DESCRIPTION OF EXEMPLARY EMBODIMENTS

Hereinafter, a resonator device, a resonator module, an electronic apparatus, and a vehicle will be described in detail based on embodiments illustrated in the appended drawings.

First Embodiment

Figure 1:
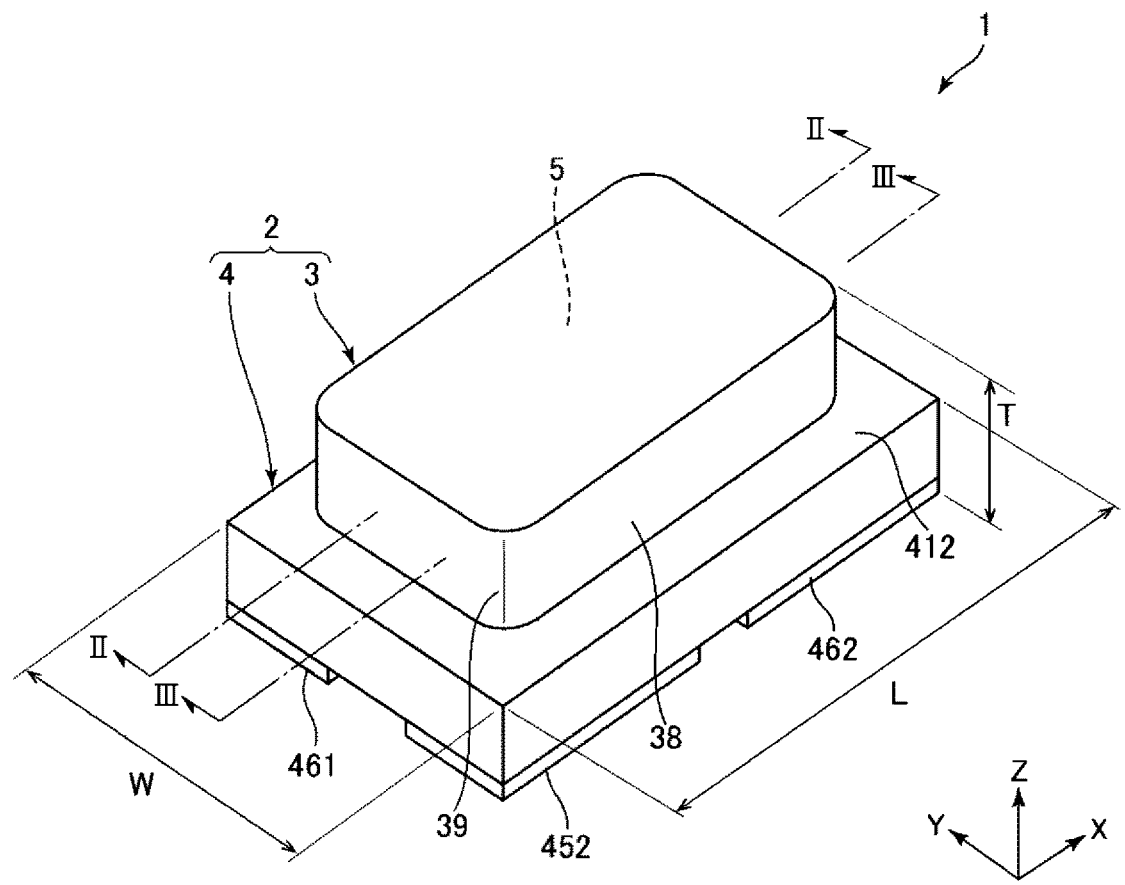
FIG. 1 is a perspective view illustrating a resonator device according to a first embodiment.
Figure 2:
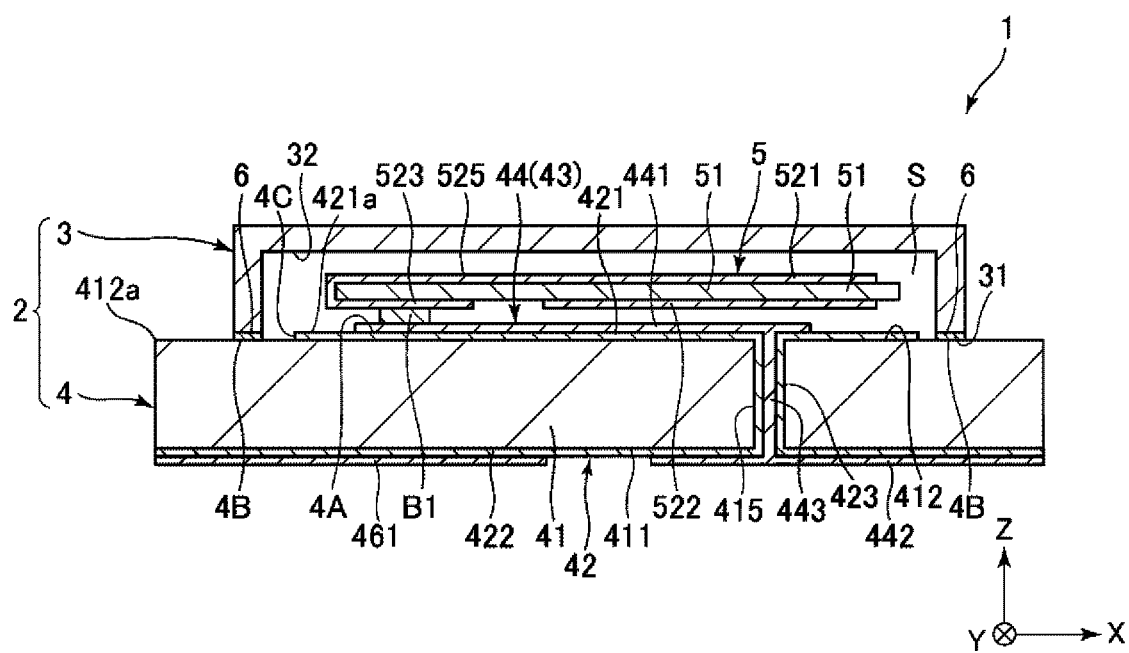
FIG. 2 is a II-II sectional view of FIG. 1.
Figure 3:
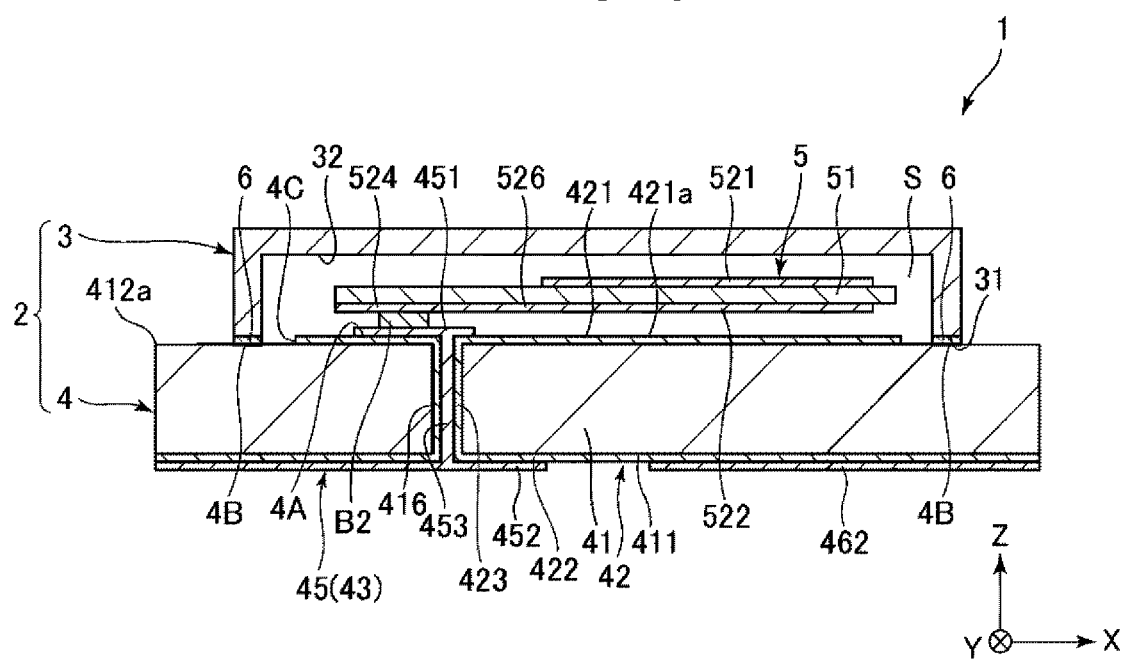
FIG. 3 is a III-III sectional view of FIG. 1.
Figure 5:
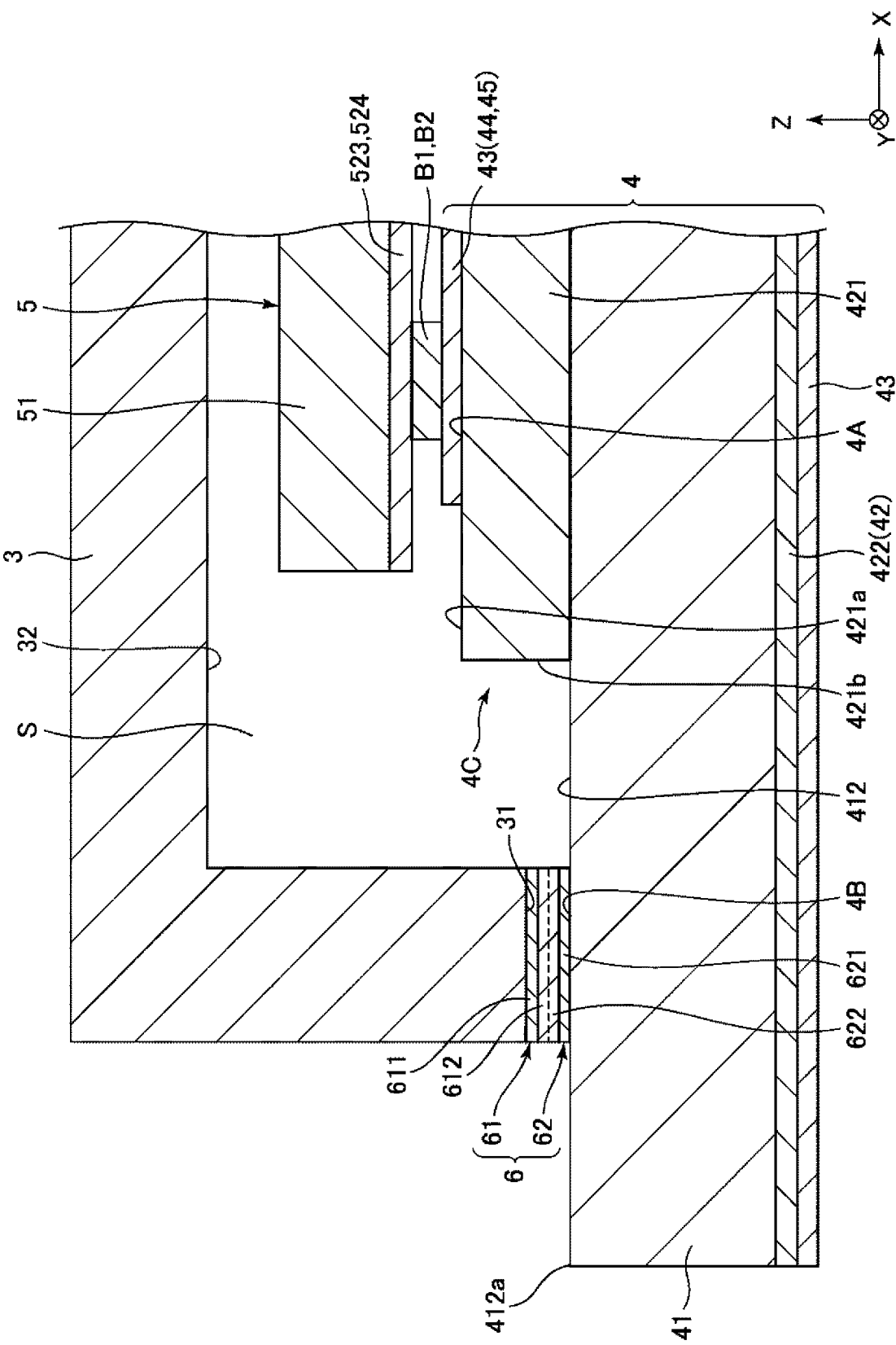
FIG. 5 is a sectional view illustrating a bonding part between a base substrate and a lid.
Figure 6:
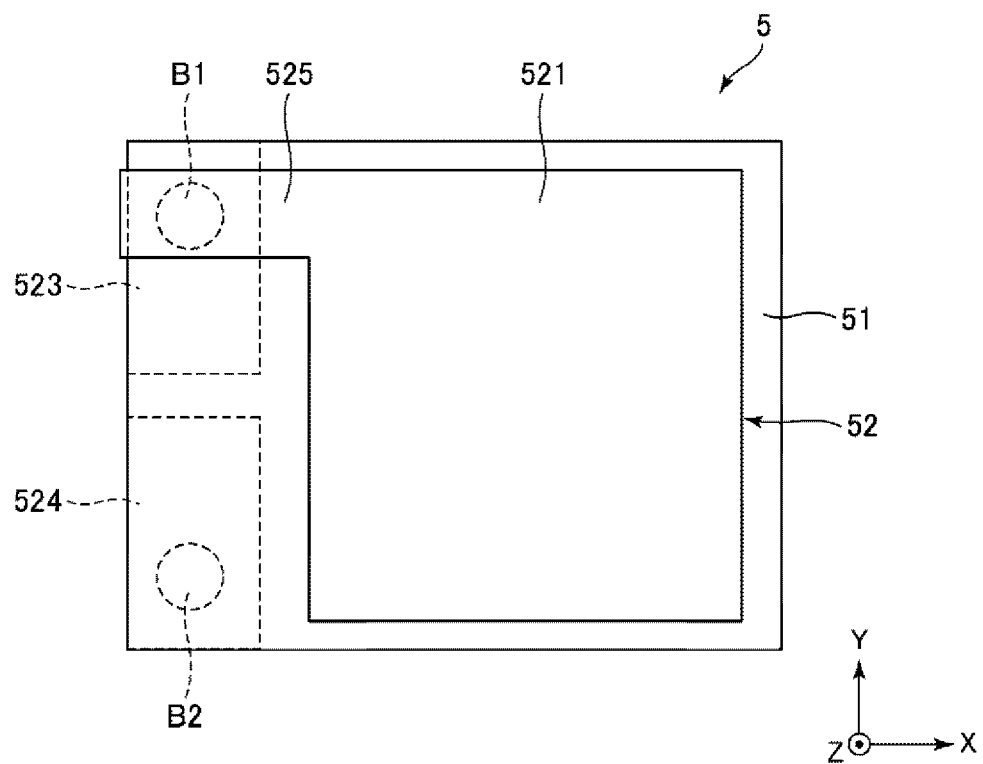
FIG. 6 is a plan view of a resonator element.
Figure 7:
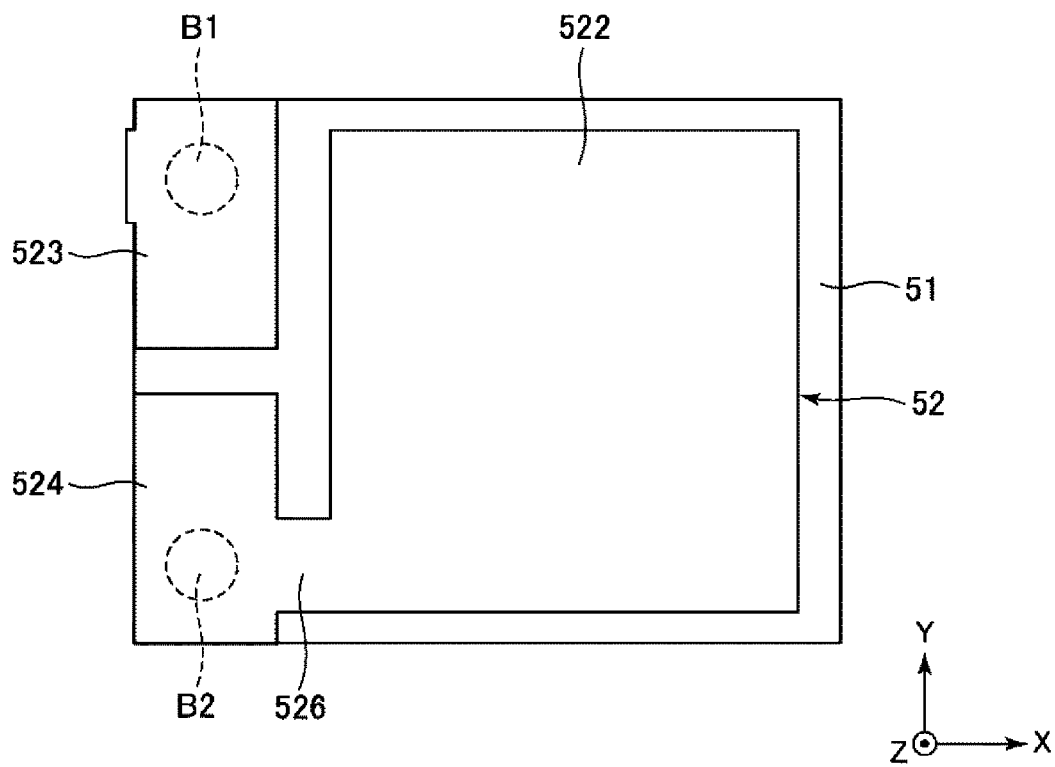
FIG. 7 is a see-through view of the resonator element seen from above.
Figure 8:
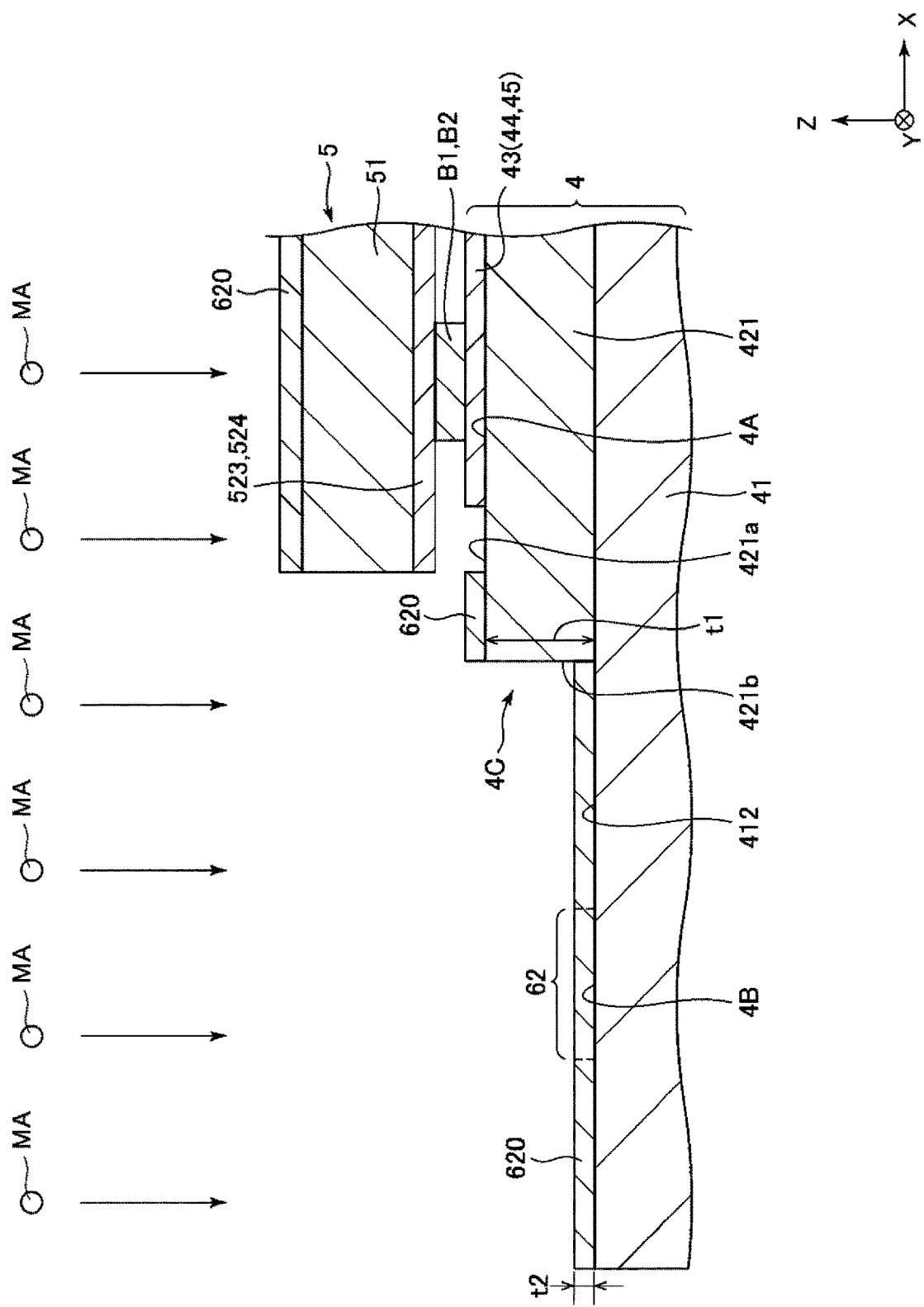
FIG. 8 is a sectional view for describing a function of a step formed in a base.
Figure 9:
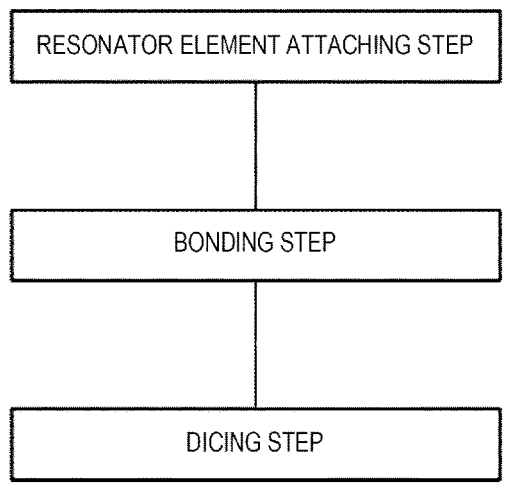
FIG. 9 is a diagram illustrating a manufacturing step of the resonator device.

FIG. 1 is a perspective view illustrating a resonator device according to a first embodiment. FIG. 2 is a II-II sectional view of FIG. 1. FIG. 3 is a sectional view of FIG. 1. FIG. 4 is a plan view of the resonator device illustrated in FIG. 1. FIG. 5 is a sectional view illustrating a bonding part between a base substrate and a lid. FIG. 6 is a plan view of a resonator element. FIG. 7 is a see-through view of the resonator element seen from above. FIG. 8 is a sectional view for describing a function of a step formed in a base. FIG. 9 is a diagram illustrating a manufacturing step of the resonator device. FIG. 10 to FIG. 17 are perspective views illustrating the manufacturing step of the resonator device. For convenience of description, three axes that are orthogonal to each other are illustrated as an X axis, a Y axis, and a Z axis in each drawing. The positive side of the Z axis denotes the "top", and the negative side of the Z axis denotes the "bottom". A plan view along the Z axis, that is, along the thickness of the base substrate, is simply referred to as a "plan view".

For example, it is assumed that a resonator device 1 illustrated in FIG. 1 is a small size resonator device of which a length L×width W×height T is approximately 1.0 mm×0.8 mm×0.25 mm. However, the size of the resonator device 1 is not particularly limited.

As illustrated in FIG. 1, the resonator device 1 includes a resonator element 5 and a package 2 accommodating the resonator element 5. As illustrated in FIG. 2 and FIG. 3, the package 2 includes a lid 3 of a box shape including a recess 32 accommodating the resonator element 5, and a base 4 of a plate shape that covers the opening of the recess 32 and is bonded to the lid 3. By covering the opening of the recess 32 with the base 4, an accommodation space S in which the resonator element 5 is accommodated is formed. The accommodation space S is airtight and is in a depressurized state or may be in a state closer to a vacuum. Accordingly, viscous resistance is decreased, and the resonator element 5 can be stably driven. The atmosphere of the accommodation space S is not particularly limited and may be, for example, an atmosphere in which inert gas such as nitrogen or Ar is sealed, or may be in an atmospheric state or a pressurized state other than the depressurized state.

The base 4 includes a base substrate 41 of a plate shape, an insulating layer 42 arranged on the surface of the base substrate 41, and an electrode 43 arranged on the insulating layer 42.

The base substrate 41 has a plate shape of which the plan view shape is a rectangle, and includes a lower surface 411 and an upper surface 412 that are in a front-rear relationship to each other. In addition, the base substrate 41 includes two through holes 415 and 416 that pass through the upper surface 412 and the lower surface 411.

The base substrate 41 is a semiconductor substrate. The semiconductor substrate is not particularly limited. For example, a silicon substrate, a germanium substrate, or a compound semiconductor substrate of GaP, GaAs, InP, or the like can be used. By using the semiconductor substrate as the base substrate 41, the base 4 can be formed using a semiconductor process. Thus, the size of the resonator device 1 can be reduced. In addition, as will be described later in other embodiments, a semiconductor circuit can be formed in the base 4, and the base 4 can be effectively used. Particularly, in the present embodiment, the silicon substrate is used as the base substrate 41. Accordingly, the base substrate 41 is inexpensive and is easily obtained.

The base substrate 41 is not limited to the semiconductor substrate. For example, a ceramic substrate or a glass substrate can be used. By using an insulating substrate such as the ceramic substrate or the glass substrate, for example, the insulating layer 42 is not needed. Thus, the configuration of the base 4 is simplified. In this case, the base 4 may be configured to include a resonator element mount surface 4A, a bonding surface 4B, and a step 4C by disposing a step on the upper surface 412 of the base substrate 41.

The insulating layer 42 is arranged on the surface of the base substrate 41. The insulating layer 42 includes an upper surface insulating layer 421 arranged on the upper surface 412 of the base substrate 41, a lower surface insulating layer 422 arranged on the lower surface 411, and a through hole insulating layer 423 arranged in the through holes 415 and 416. The lower surface insulating layer 422 is arranged in the whole area of the lower surface 411, and the through hole insulating layer 423 is arranged in the whole area of the inner circumferential surfaces of the through holes 415 and 416. Meanwhile, the upper surface insulating layer 421 is arranged in the center of the upper surface 412 except for the outer edge of the upper surface 412. That is, the outer edge of the upper surface 412 is exposed from the upper surface insulating layer 421. The insulating layer 42 is not particularly limited. In the present embodiment, a silicon oxide film ($SiO_2$ film) is used. A forming method for the insulating layer 42 is not particularly limited. For example, the insulating layer 42 may be formed by subjecting the surface of the base substrate 41 to thermal oxidation, or may be formed by plasma CVD using tetraethoxysilane (TEOS).

The electrode 43 is arranged on the insulating layer 42. The electrode 43 includes a first interconnect 44 and a second interconnect 45 that are arranged to be spaced apart from each other. The first interconnect 44 includes an internal terminal 441 that is arranged on the upper surface insulating layer 421 and that abuts the inside of the accommodation space S, an external terminal 442 that is arranged on the lower surface insulating layer 422 and that abuts the outside of the package 2, and a through electrode 443 that is arranged in the through hole 415 and that electrically couples the internal terminal 441 to the external terminal 442. Similarly, the second interconnect 45 includes an internal terminal 451 that is arranged on the upper surface insulating layer 421 and that abuts the inside of the accommodation space S, an external terminal 452 that is arranged on the lower surface insulating layer 422 and that abuts the outside of the package 2, and a through electrode 453 that is arranged in the through hole 416 and that electrically couples the internal terminal 451 to the external terminal 452. In addition, the electrode 43 includes two dummy electrodes 461 and 462 arranged on the lower surface insulating layer 422.

The lid 3 has a box shape and includes the bottomed recess 32 that is open on a lower surface 31. As illustrated in FIG. 4, the plan view shape of the lid 3 is a rectangle almost similar to the upper surface 412 of the base substrate 41, and is formed to be slightly smaller than the upper surface 412. That is, in plan view, the outer edge of the lid 3 does not overlap with an outer edge 412a of the upper surface 412 and is positioned inside the outer edge 412a. The lid 3 includes a side surface 38 that includes four planar surfaces 381. Each corner 39 among the four planar surfaces 381 is rounded. Accordingly, concentration of stress on the corner 39 is reduced, and the occurrence of a crack or the like starting from the corner 39 can be effectively reduced. The shape of the lid 3 is not particularly limited. Each corner 39 may not be rounded. Furthermore, a corner between the side surface 38 and the upper surface may be rounded.

The lid 3 is a semiconductor substrate. The semiconductor substrate is not particularly limited. For example, a silicon substrate, a germanium substrate, or a compound semiconductor substrate of GaP, GaAs, InP, or the like can be used. By using the semiconductor substrate as the lid 3, the lid 3 can be formed using a semiconductor process. Thus, the size of the resonator device 1 can be reduced. Particularly, in the present embodiment, the silicon substrate is used as the lid 3. Accordingly, the lid 3 is inexpensive and is easily obtained. In addition, the materials of the base substrate 41 and the lid 3 can be matched, and a difference in coefficient of thermal expansion between the materials can be substantially equal to zero. Thus, the occurrence of thermal stress caused by thermal expansion is reduced, and the resonator device 1 has excellent resonance characteristics.

The lid 3 is not limited to the semiconductor substrate. For example, a ceramic substrate or a glass substrate can be used. A type of substrate different from the base substrate 41 may be used as the lid 3. Particularly, when the glass substrate having light-transmitting characteristics is used as the lid 3, a part of an excitation electrode 521 can be removed by irradiating the resonator element 5 with a laser through the lid 3 after the manufacturing of the resonator device 1, and the frequency of the resonator element 5 can be adjusted.

The lid 3 is directly bonded to the upper surface 412 of the base substrate 41 through a bonding member 6 on the lower surface 31. In the present embodiment, the lid 3 and the base substrate 41 are bonded using diffusion bonding that uses diffusion between metals among types of direct bonding. Specifically, as illustrated in FIG. 5, a metal film 61 is disposed on the lower surface 31 of the lid 3, and a metal film 62 is disposed on the upper surface 412 of the base substrate 41. The bonding member 6 is formed by diffusion-bonding the lower surface of the metal film 61 to the upper surface of the metal film 62. The lid 3 and the base substrate 41 are bonded through the bonding member 6.

For example, the metal film 61 is configured by forming a plated layer 612 that is a stack of nickel (Ni)/palladium (Pd)/gold (Au) on a base 611 formed of copper (Cu). Similarly, the metal film 62 is configured by forming a plated layer 622 that is a stack of Ni/Pd/Au on a base 621 formed of Cu. Alternatively, the metal films 61 and 62 may be configured to include a ground layer that is a thin film of chrome or titanium, and a thin film of gold formed above the ground layer by sputtering. The layers of gold on the surfaces of the metal films 61 and 62 are diffusion-bonded. According to the diffusion bonding, the lid 3 and the base substrate 41 can be bonded at room temperature (a temperature lower than the melting points of the metal films 61 and 62). Thus, internal stress is unlikely to remain in the package 2, and thermal damage to the resonator element 5 is reduced.

As illustrated in FIG. 6 and FIG. 7, the resonator element 5 includes a resonator substrate 51 and an electrode 52 arranged on the surface of the resonator substrate 51. The resonator substrate 51 has a thickness shear resonation mode and is formed of an AT cut quartz crystal substrate in the present embodiment. The AT cut quartz crystal substrate has three-dimensional frequency-temperature characteristics and is used as the resonator element 5 having excellent temperature characteristics.

The electrode 52 includes the excitation electrode 521 arranged on the upper surface of the resonator substrate 51 and an excitation electrode 522 arranged on the lower surface of the resonator substrate 51 in opposition to the excitation electrode 521 through the resonator substrate 51. In addition, the electrode 52 includes a pair of terminals 523 and 524 arranged on the lower surface of the resonator substrate 51, an interconnect 525 electrically coupling the terminal 523 to the excitation electrode 521, and an interconnect 526 electrically coupling the terminal 524 to the excitation electrode 522.

The configuration of the resonator element 5 is not limited to the above configuration. For example, the resonator element 5 may be of a mesa type in which a resonance area interposed between the excitation electrodes 521 and 522 protrudes from the surrounding area of the resonance area. Conversely, the resonator element 5 may be of an inverted mesa type in which the resonance area recessed from the surrounding area of the resonance area. In addition, a bevel process of grinding the surrounding area of the resonator substrate 51, or a convex process of forming the upper surface and the lower surface of the resonator substrate 51 into convex surfaces may be performed.

The resonator element 5 that resonates in the thickness shear resonance mode is not for limitation purposes. For example, the resonator element 5 may be a tuning fork type resonator element of which two vibrating arms are subjected to tuning fork resonance in an in-plane direction. That is, the resonator substrate 51 is not limited to the AT cut quartz crystal substrate and may be a quartz crystal substrate other than the AT cut quartz crystal substrate such as an X cut quartz crystal substrate, a Y cut quartz crystal substrate, a Z cut quartz crystal substrate, a BT cut quartz crystal substrate, an SC cut quartz crystal substrate, or an ST cut quartz crystal substrate. In the present embodiment, the resonator substrate is formed of quartz crystal. However, the present embodiment is not for limitation purposes. For example, the resonator substrate 51 may be formed of a piezoelectric single crystal such as lithium niobate, lithium tantalate, lithium tetraborate, langasite, potassium niobate, or gallium phosphate, or may be formed of other piezoelectric single crystals. Furthermore, the resonator element 5 is not limited to the piezoelectric drive type resonator element and may be an electrostatic drive type resonator element that uses electrostatic force.

As illustrated in FIG. 2 and FIG. 3, the resonator element 5 is attached on the upper surface insulating layer 421 through conductive bonding members B1 and B2. The conductive bonding member B1 electrically couples the internal terminal 441 of the base 4 to the terminal 523 of the resonator element 5. The conductive bonding member B2 electrically couples the internal terminal 451 of the base 4 to the terminal 524 of the resonator element 5.

The conductive bonding members B1 and B2 are not particularly limited as long as the conductive bonding members B1 and B2 have both conductivity and bondability. For example, various metal bumps such as a gold bump, a silver bump, a copper bump, and a solder bump, and conductive adhesives obtained by dispersing a conductive filler such as a silver filler into various polyimide-based, epoxy-based, silicone-based, and acrylic-based adhesives can be used. When the former metal bumps are used as the conductive bonding members B1 and B2, the occurrence of gas from the conductive bonding members B1 and B2 can be reduced, and an environmental change in the accommodation space S, particularly, an increase in pressure, can be effectively reduced. Meanwhile, when the latter conductive adhesives are used as the conductive bonding members B1 and B2, the conductive bonding members B1 and B2 are softer than the metal bumps, and stress is unlikely to occur in the resonator element 5.

As illustrated in FIG. 5, in the resonator device 1 having such a configuration, the base 4 includes the resonator element mount surface 4A that is included in the upper surface 421a of the upper surface insulating layer 421 and to which the resonator element 5 is attached, and the bonding surface 4B that is included in the upper surface 412 of the base substrate 41 and is bonded to the lid 3 through the bonding member 6. The base 4 includes the step 4C formed between the resonator element mount surface 4A and the bonding surface 4B. The step 4C is formed by a side surface 421b of the upper surface insulating layer 421. That is, the resonator element mount surface 4A deviates upward from the bonding surface 4B by the thickness of the upper surface insulating layer 421. In other words, the position of the surface on one side of the side surface 421b deviates from the position of the surface on the other side of the side surface 421b along the Z axis. By forming the step 4C between the resonator element mount surface 4A and the bonding surface 4B, contact between the bonding member 6 arranged on the bonding surface 4B and the first and second interconnects 44 and 45 arranged on the upper surface 421a of the upper surface insulating layer 421 is reduced, and electrical coupling between the bonding member 6 and the first and second interconnects 44 and 45 can be effectively reduced. Thus, short-circuiting of the first and second interconnects 44 and 45 through the metal film 62 is reduced, and the resonator device 1 having high reliability is obtained.

Specifically, as illustrated in FIG. 8, for example, the metal film 62 arranged on the bonding surface 4B is formed by depositing a metal film 620 by causing metal atoms MA to adhere to the upper surface 412 of the base substrate 41 by sputtering. In the sputtering, when the step 4C is formed between the upper surface 412 and the resonator element mount surface 4A, the metal film 620 deposited on the upper surface 412 and the metal film 620 deposited on the resonator element mount surface 4A are separated by the step 4C. The metal film 62 is formed by the metal film 620 deposited on the upper surface 412. Since the first and second interconnects 44 and 45 are arranged on the resonator element mount surface 4A, contact between the metal film 62 and the first and second interconnects 44 and 45 is reduced by the step 4C. Accordingly, short-circuiting of the first and second interconnects 44 and 45 through the metal film 62 can be effectively reduced. In the drawings other than FIG. 8, a part of the metal film 620 other than the metal film 62 is not illustrated for convenience of description.

In order to more securely separate the metal film 620 by the step 4C, the side surface 421b of the upper surface insulating layer 421 forming the step 4C may be formed at an angle closer to perpendicularity with respect to the upper surfaces 412 and 421a as illustrated in FIG. 8. In addition, for example, the side surface 421b may be a curved concave surface and have a shape in which a part of the side surface 421b is recessed inside from the outer edge of the upper surface 421a, that is, an overhung shape. The configuration of the side surface 421b is not for limitation purposes.

When the height of the step 4C, that is, the thickness of the upper surface insulating layer 421 is denoted by t1, and the thickness of the metal film 62 is denoted by t2, t1 and t2 satisfy t1>t2. Accordingly, the metal film 620 can be more securely separated by the step 4C. Furthermore, t1 and t2 may satisfy t1≤10×t2, more desirably t1≥15×t2, and further desirably t1≤20×t2. In addition, for example, when the size of the package 2 is a small size such that the length L×width W×height T is approximately 1.0 mm×0.8 mm×0.25 mm, the thickness t2 of the metal film 62 is approximately 10 nm to 20 nm. Thus, the height t1 of the step 4C may be greater than or equal to 100 nm. Accordingly, the above effect can be more noticeably exhibited.

As illustrated in FIG. 4, in the present embodiment, the whole areas of the first interconnect 44 and the second interconnect 45 arranged on the resonator element mount surface 4A, that is, the internal terminal 441 and 451, overlap with the resonator element 5. In other words, in plan view, the whole areas of the internal terminals 441 and 451 are positioned inside the outer edge of the resonator element 5. By having such a configuration, the resonator element 5 is used as a mask in the deposition of the metal film 62 by sputtering. Deposition of the metal film 620 on the internal terminals 441 and 451 or at an area between the internal terminals 441 and 451 is reduced, and short-circuiting of the internal terminals 441 and 451 can be effectively reduced. The metal film 620 may also be deposited on the outer edge part of the areas overlapping with the resonator element 5 due to the metal atoms MA passing around the resonator element 5. Thus, the internal terminals 441 and 451 may not overlap with the outer edge of the resonator element 5 and may be positioned sufficiently inside the outer edge in plan view.

In the present embodiment, the whole areas of the internal terminals 441 and 451 overlap with the resonator element 5 in plan view. However, the present embodiment is not for limitation purposes. For example, one of the internal terminals 441 and 451 may protrude from the resonator element 5. By having such a configuration, short-circuiting of the internal terminals 441 and 451 through the metal film 620 can be reduced in the same manner as the present embodiment.

As illustrated in FIG. 6 and FIG. 7, in the resonator element 5 of the present embodiment, the excitation electrode 521 and the interconnect 525 coupled to the excitation electrode 521 are arranged on the upper surface side of the resonator substrate 51, and the terminal 524 and the interconnect 526 coupled to an electrode having a different electric potential, that is, the excitation electrode 522, are not arranged. Thus, in the deposition of the metal film 620 by sputtering, short-circuiting of the excitation electrodes 521 and 522 do not occur even when the metal film 620 is deposited on the upper surface of the resonator substrate 51. The metal film 620 is deposited on the resonator substrate 51, and apart of the metal film 620 overlapping with the excitation electrode 521 functions as a part of the excitation electrode 521. Thus, the excitation electrode 521 may be thinly formed in advance by predicting the thickness of the deposited metal film 620. Accordingly, a deviation in thickness of the excitation electrode 521 from a design value can be reduced.

The resonator device 1 is described thus far. As described above, the resonator device 1 includes the base 4, the resonator element 5 attached to the base 4, the lid 3 that is a cover accommodating the resonator element 5 between the base 4 and the cover, and the conductive bonding member 6 that is positioned between the base 4 and the lid 3 and that bonds the base 4 to the lid 3. The base 4 includes the resonator element mount surface 4A on which the resonator element 5 is attached, the first interconnect 44 and the second interconnect 45 that are arranged on the resonator element mount surface 4A and that are electrically coupled to the resonator element 5, the bonding surface 4B bonded to the lid 3 through the bonding member 6, and the step 4C arranged between the resonator element mount surface 4A and the bonding surface 4B. By forming the step 4C between the resonator element mount surface 4A and the bonding surface 4B and arranging the first interconnect 44 and the second interconnect 45 on the resonator element mount surface 4A, electrical coupling between the bonding member 6 and the first and second interconnects 44 and 45 can be reduced. Thus, for example, short-circuiting of the first interconnect 44 and the second interconnect 45 through the bonding member 6 can be reduced, and the resonator device 1 having high reliability is obtained.

As described above, the base 4 includes the base substrate 41 that includes the upper surface 412 which is a first surface positioned on the lid 3 side, and the upper surface insulating layer 421 that is an insulating layer arranged on the upper surface 412 of the base substrate 41. The bonding surface 4B is included in the upper surface 412, and the resonator element mount surface 4A is included in the upper surface 421a that is a second surface on the side of the upper surface insulating layer 421 opposite to the base substrate 41. By having such a configuration, the step 4C can be easily formed.

As described above, each of the first interconnect 44 and the second interconnect 45 overlaps with the resonator element 5 in plan view taken along a line normal to the resonator element mount surface 4A. Accordingly, even when the metal film 62 is deposited by sputtering as described above, short-circuiting of the first interconnect 44 and the second interconnect 45 can be reduced. Thus, for example, the first and second interconnects 44 and 45 do not need to be covered with a mask during the deposition of the metal film 62, and the metal film 62 is easily formed.

As described above, when the height of the step 4C is denoted by t1, and the thickness of the metal film 62 of the bonding member 6 is denoted by t2, t1≤10×t2 may be satisfied. In addition, t1≤100 nm may be satisfied. Accordingly, the metal film 620 can be more securely separated by the step 4C, and electrical coupling between the bonding member 6 and the first and second interconnects 44 and 45 can be effectively reduced.

As described above, the base substrate 41 is a semiconductor substrate. Accordingly, since the base 4 can be formed using a semiconductor process, the size of the resonator device 1 can be reduced. In addition, as will be described later in other embodiments, a semiconductor circuit can be formed in the base 4, and the base 4 can be effectively used.

Next, a manufacturing method for the resonator device 1 will be described. As illustrated in FIG. 9, the manufacturing method for the resonator device 1 includes a resonator element attaching step of preparing a base wafer 400 including a plurality of integrated bases 4 and attaching the resonator element 5 to each base 4, a bonding step of bonding a lid wafer 300 including a plurality of integrated lids 3 to the base wafer 400 and forming a device wafer 100 including a plurality of integrated resonator devices 1, and a dicing step of dicing the plurality of resonator devices 1 from the device wafer 100. Hereinafter, the manufacturing method will be described based on FIG. 10 to FIG. 18. FIG. 10 to FIG. 18 are sectional views corresponding to FIG. 2.

Resonator Element Attaching Step

Figure 10:
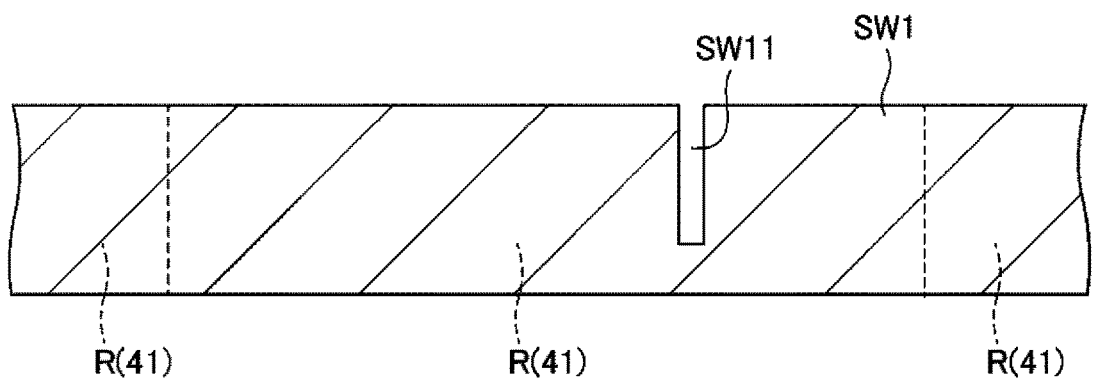
FIG. 10 is a sectional view illustrating the manufacturing step of the resonator device.
Figure 11:
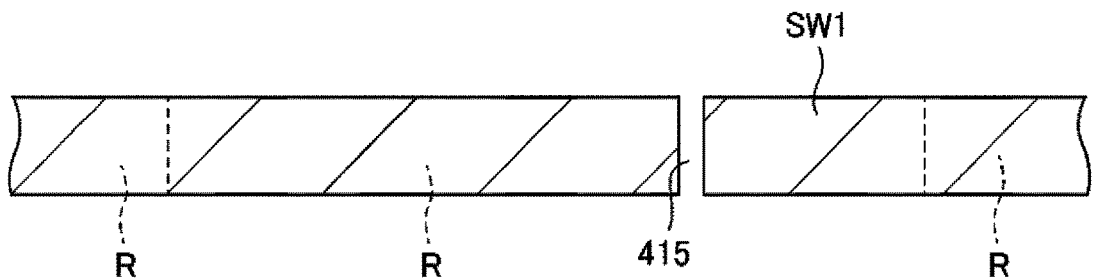
FIG. 11 is a sectional view illustrating the manufacturing step of the resonator device.

First, as illustrated in FIG. 10, a silicon wafer SW1 that is a base material of the base substrate 41 is prepared. In the silicon wafer SW1, a plurality of dicing areas R each of which forms one base substrate 41 by a dicing step described later are arranged in a matrix. Next, in each dicing area R, two bottomed recesses SW11 are formed from the upper surface side of the silicon wafer SW1. For example, the recess SW11 can be formed by dry etching represented by the Bosch process. Next, as illustrated in FIG. 11, the silicon wafer SW1 is ground and polished from the lower surface side of the silicon wafer SW1. The silicon wafer SW1 is thinned until the recess SW11 passes through the silicon wafer SW1. Accordingly, the through holes 415 and 416 are formed in each dicing area R.

Figure 12:
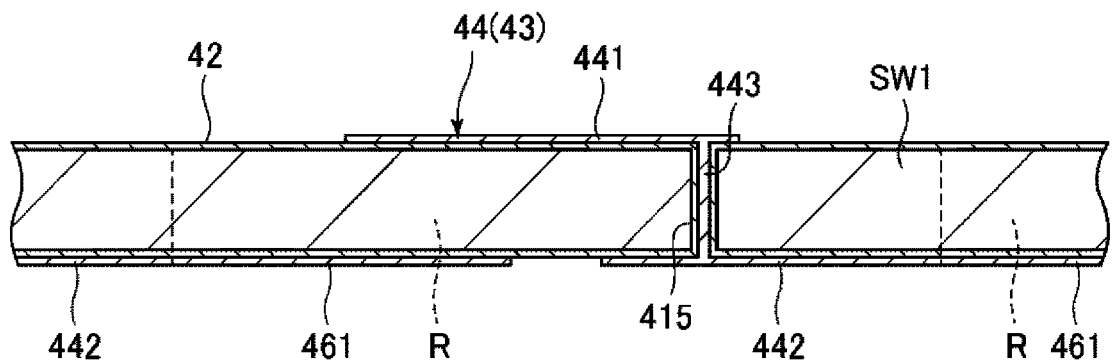
FIG. 12 is a sectional view illustrating the manufacturing step of the resonator device.

Next, as illustrated in FIG. 12, the insulating layer 42 that is formed with a silicon oxide film is formed on the surface of the silicon wafer SW1. Furthermore, the electrode 43 is formed on the insulating layer 42 in each dicing area R. For example, the insulating layer 42 can be formed by thermal oxidation or a plasma CVD method using TEOS. The electrode 43 can be formed by depositing a metal film on the insulating layer 42 by vapor deposition or sputtering and patterning the metal film by etching. The upper surface insulating layer 421 may be formed before the present step.

Figure 13:
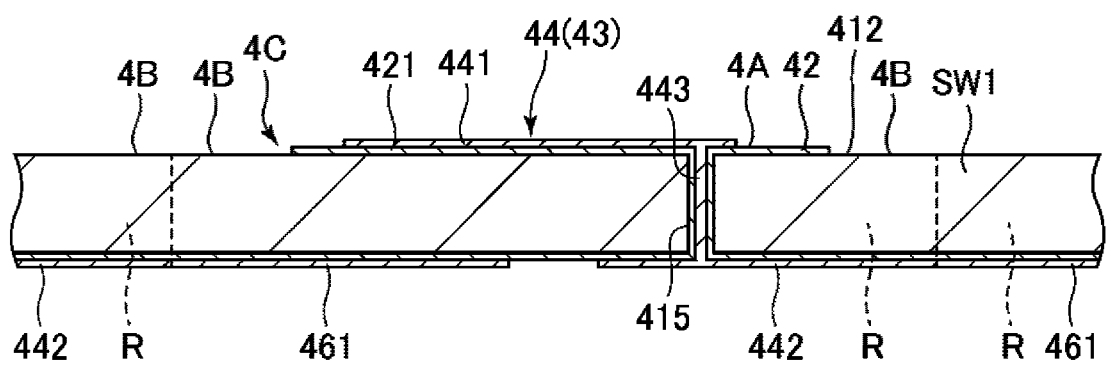
FIG. 13 is a sectional view illustrating the manufacturing step of the resonator device.
Figure 14:
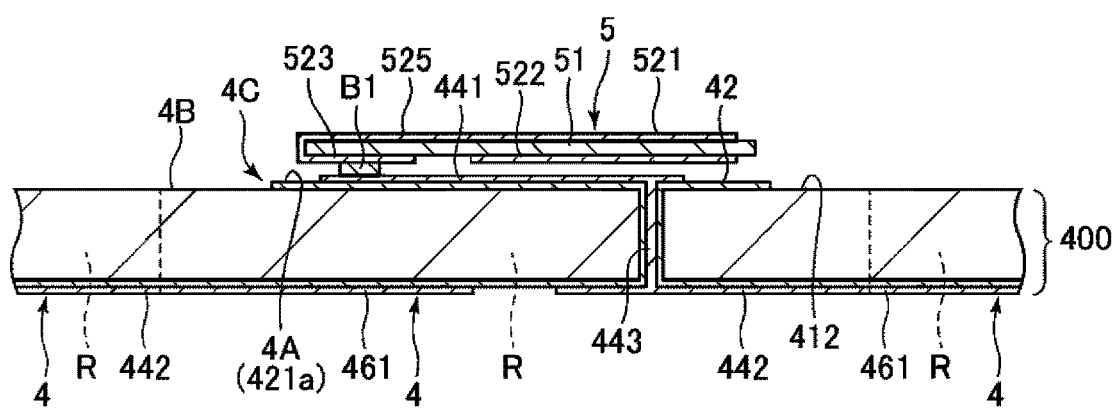
FIG. 14 is a sectional view illustrating the manufacturing step of the resonator device.

Next, as illustrated in FIG. 13, a part of the upper surface insulating layer 421 is removed, and the outer periphery of the upper surface 412 is exposed from the upper surface insulating layer 421 in each dicing area R. Accordingly, the bonding surface 4B is formed from the upper surface 412, and the step 4C is formed between the upper surface 412 and the upper surface insulating layer 421. Through the steps described thus far, a base wafer 400 in which a plurality of bases 4 are integrated is obtained. Next, as illustrated in FIG. 14, the resonator element 5 is attached to the resonator element mount surface 4A of each base 4 through the conductive bonding members B1 and B2.

Bonding Step

Figure 15:
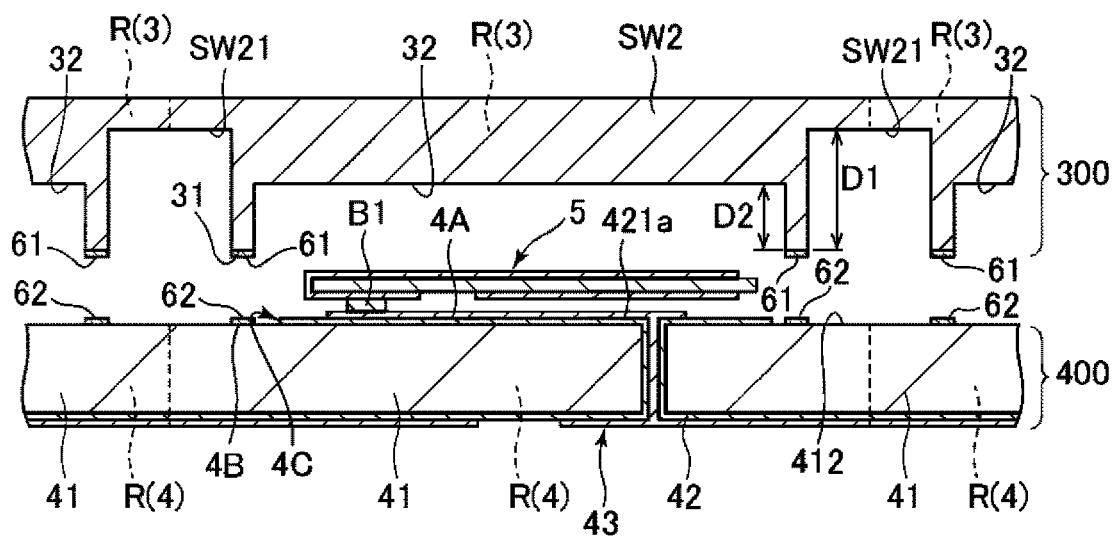
FIG. 15 is a sectional view illustrating the manufacturing step of the resonator device.

First, as illustrated in FIG. 15, a silicon wafer SW2 that is a base material of the lid 3 is prepared. In the silicon wafer SW2, a plurality of dicing areas R each of which forms one lid 3 by dicing described later are arranged in a matrix. Next, the bottomed recess 32 is formed in each dicing area R from the lower surface side of the silicon wafer SW2, and a recess SW21 is formed along a boundary between adjacent dicing areas R. For example, the recesses 32 and SW21 can be formed by dry etching represented by the Bosch process. A depth D1 of the recess SW21 is greater than a depth D2 of the recess 32. Through the steps described thus far, a lid wafer 300 in which a plurality of lids 3 are integrated is obtained.

Figure 16:
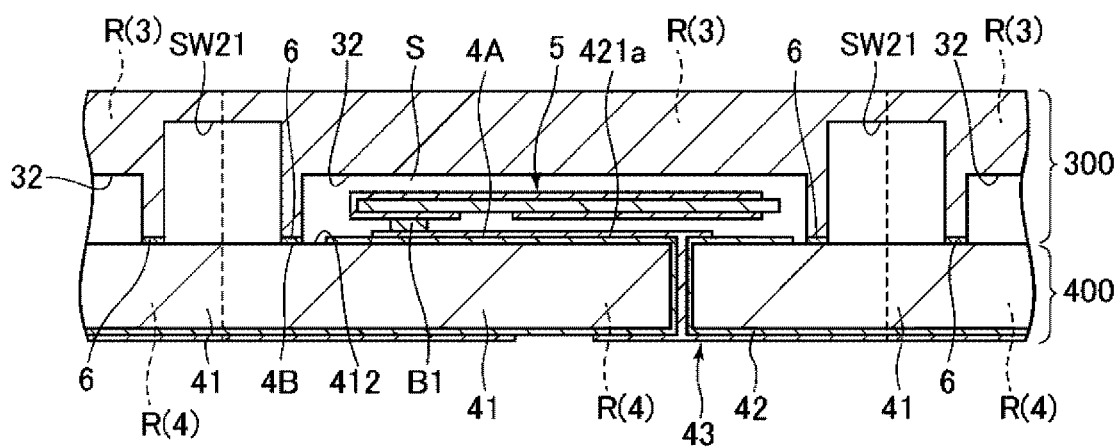
FIG. 16 is a sectional view illustrating the manufacturing step of the resonator device.

Next, the metal film 62 is formed on the upper surface 412 of each base substrate 41, and the metal film 61 is formed on the lower surface 31 of each lid 3. As described above, the metal film 62 is deposited by sputtering. However, short-circuiting of the first and second interconnects 44 and 45 and short-circuiting of the excitation electrodes 521 and 522 through the metal film 62 are effectively reduced (refer to FIG. 8). Next, for example, the surfaces of the metal films 61 and 62 are activated by blowing Ar gas to the metal films 61 and 62. As illustrated in FIG. 16, the base wafer 400 and the lid wafer 300 are directly bonded by diffusion-bonding the metal films 61 and 62.

Figure 17:
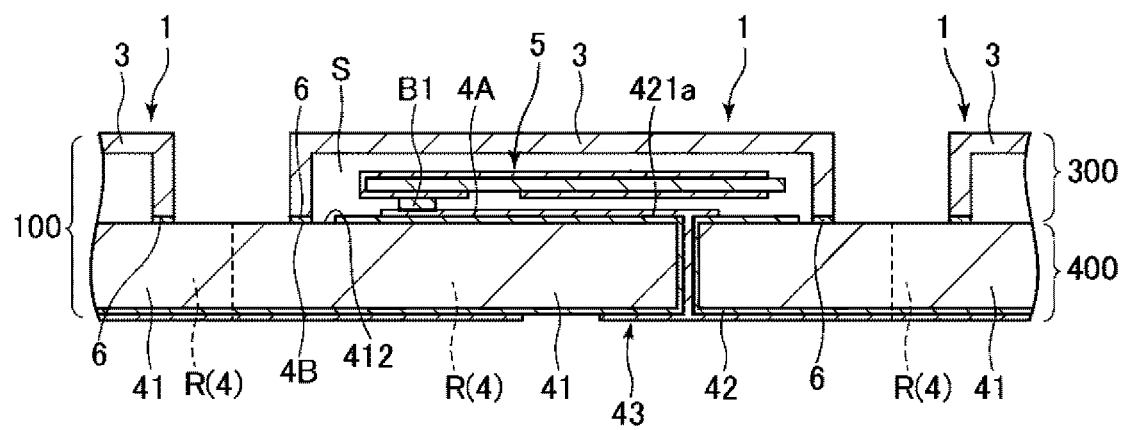
FIG. 17 is a sectional view illustrating the manufacturing step of the resonator device.

Next, as illustrated in FIG. 17, the lid wafer 300 is ground and polished from the upper surface of the lid wafer 300, and the lid wafer 300 is thinned until the recess SW21 passes through the lid wafer 300. Accordingly, the lid 3 in each dicing area R is diced. Through the steps described thus far, a device wafer 100 in which a plurality of resonator devices 1 are integrated is obtained.

Dicing Step

Next, each resonator device 1 is diced from the device wafer 100 using a dicing blade. A dicing method is not particularly limited. Accordingly, a plurality of resonator devices 1 are manufactured at once.

Second Embodiment

Figure 18:
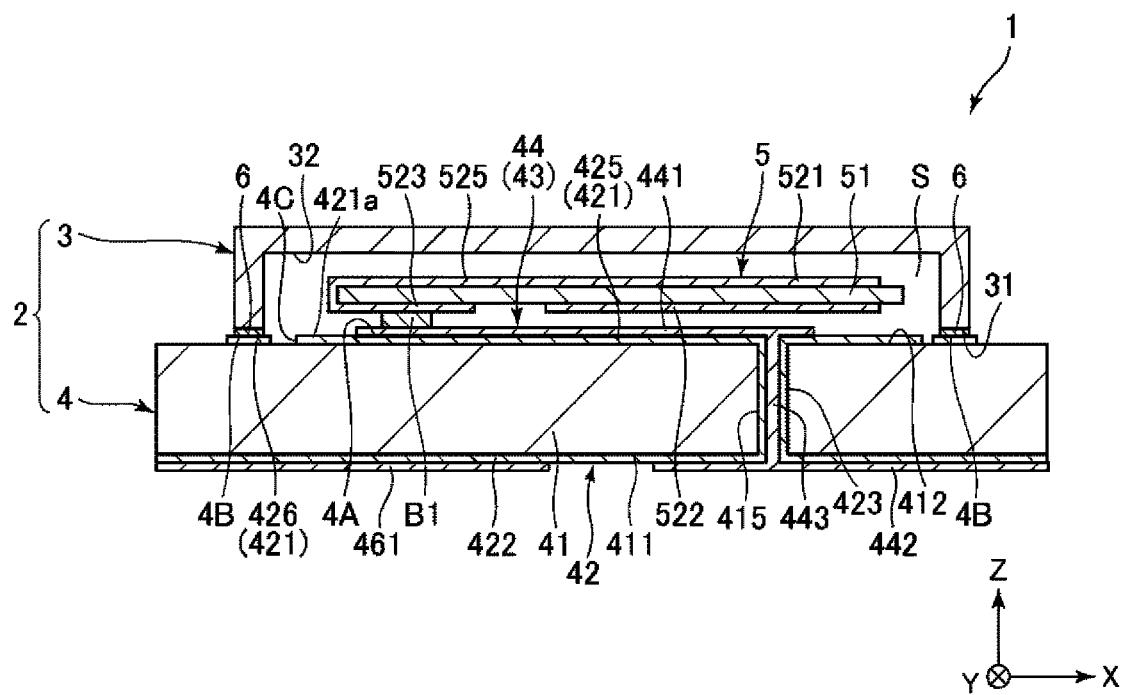
FIG. 18 is a sectional view illustrating a resonator device according to a second embodiment.
Figure 19:
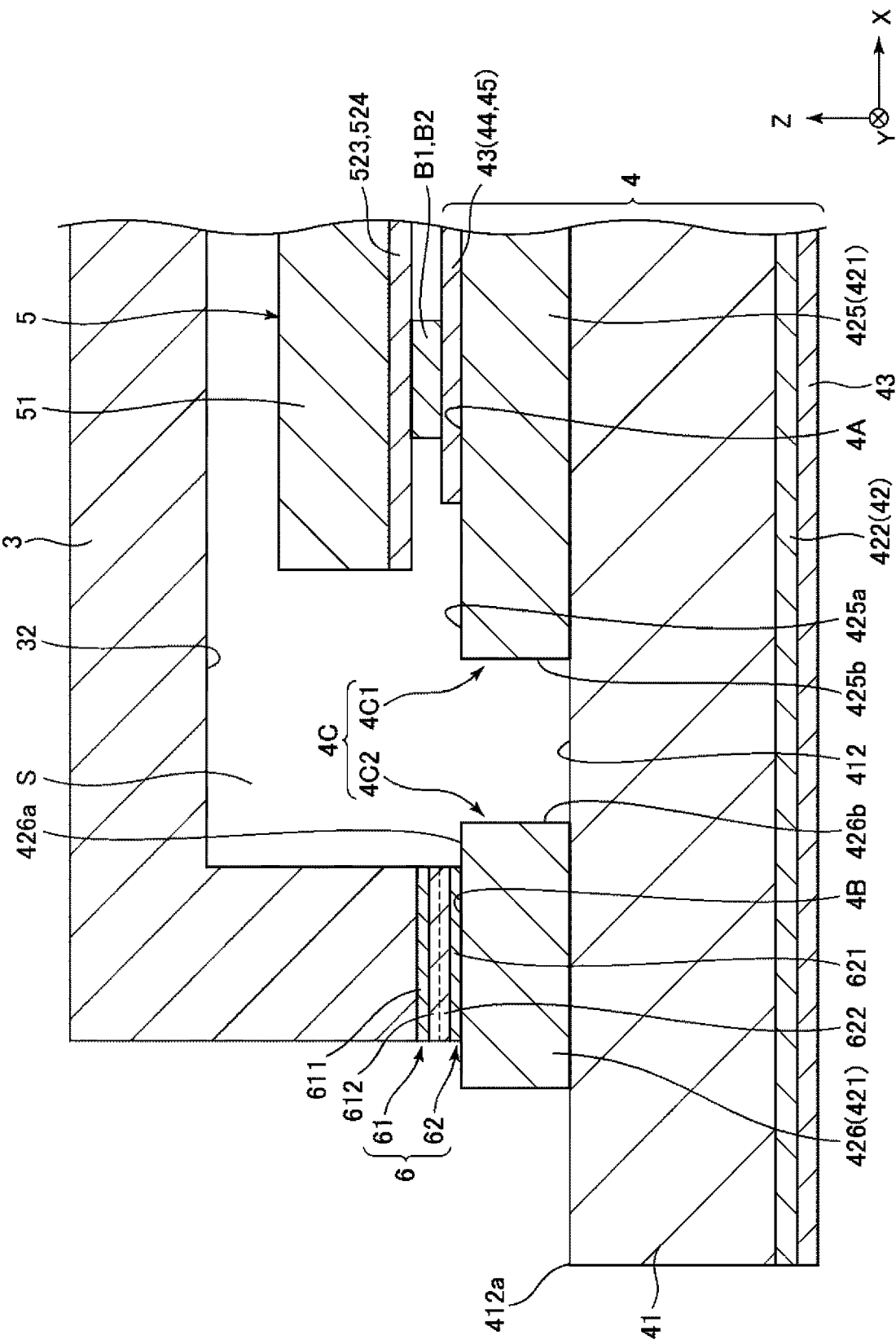
FIG. 19 is a sectional view illustrating a bonding part between a base and a lid.

FIG. 18 is a sectional view illustrating a resonator device according to a second embodiment. FIG. 19 is a sectional view illustrating a bonding part between a base and a lid.

The resonator device 1 according to the present embodiment is the same as the resonator device 1 of the first embodiment except that the configuration of the base 4 is different. In the following description, differences between the resonator device 1 of the second embodiment and the resonator device 1 of the first embodiment will be mainly described, and the same matters will not be described. In FIG. 18 and FIG. 19, the same configurations as the above embodiment are designated by the same reference signs.

As illustrated in FIG. 18 and FIG. 19, the upper surface insulating layer 421 includes a first upper surface insulating layer 425 arranged in the center of the upper surface 412 of the base substrate 41, and a second upper surface insulating layer 426 arranged in a frame shape in the outer periphery of the upper surface 412 by surrounding the first upper surface insulating layer 425. The resonator element mount surface 4A is included in an upper surface 425a of the first upper surface insulating layer 425, and the bonding surface 4B is included in an upper surface 426a of the second upper surface insulating layer 426. The first upper surface insulating layer 425 and the second upper surface insulating layer 426 are arranged to be spaced apart from each other. The step 4C is formed between the first upper surface insulating layer 425 and the second upper surface insulating layer 426. The step 4C includes a first step 4C1 formed by a side surface 425b of the first upper surface insulating layer 425, and a second step 4C2 formed by a side surface 426b of the second upper surface insulating layer 426.

The base 4 of the present embodiment includes the base substrate 41 that includes the upper surface 412 which is the first surface positioned on the lid 3 side, the first upper surface insulating layer 425 that is a first insulating layer arranged on the upper surface 412 side of the base substrate 41, and the second upper surface insulating layer 426 that is a second insulating layer arranged to be spaced apart from the first upper surface insulating layer 425 in a frame shape surrounding the first upper surface insulating layer 425 on the upper surface 412 side of the base substrate 41. The resonator element mount surface 4A is included in the upper surface 425a that is the second surface on the side of the first upper surface insulating layer 425 opposite to the base substrate 41. The bonding surface 4B is included in the upper surface 426a that is a third surface on the side of the second upper surface insulating layer 426 opposite to the base substrate 41. By having such a configuration, the step 4C can be easily formed.

According to the second embodiment, the same effect as the first embodiment can be exhibited.

Third Embodiment

Figure 20:
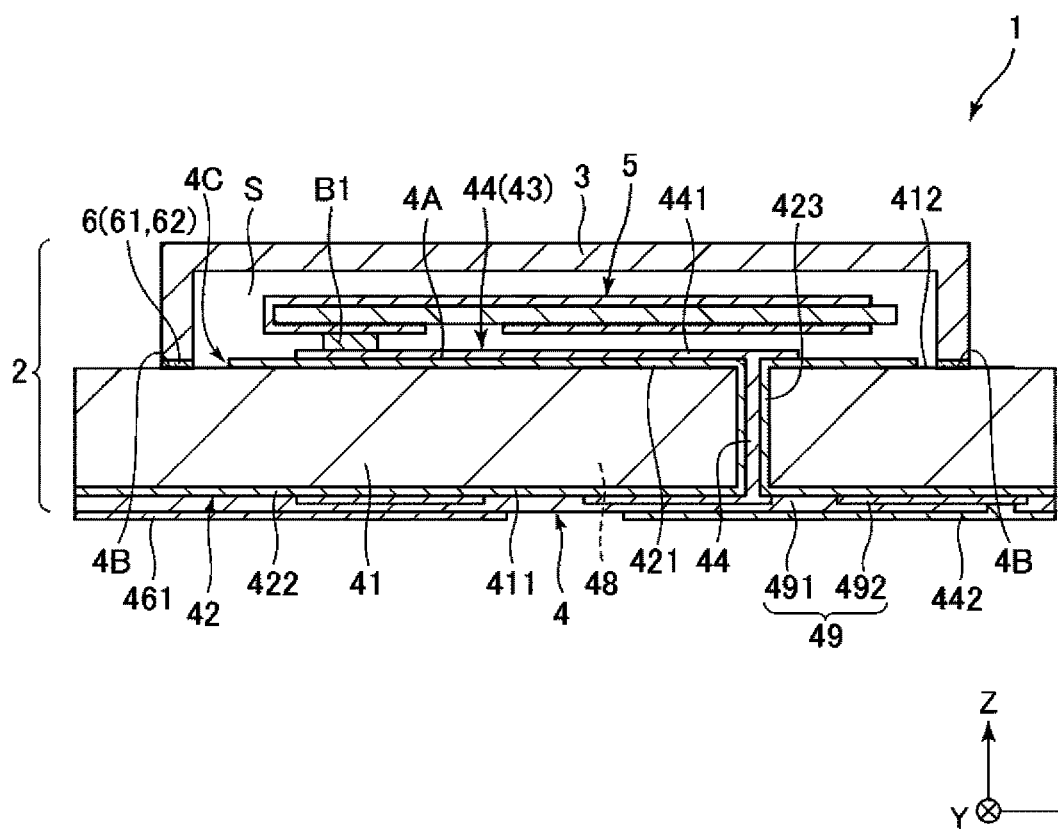
FIG. 20 is a sectional view illustrating a resonator device according to a third embodiment.

FIG. 20 is a sectional view illustrating a resonator device according to a third embodiment.

The resonator device 1 according to the present embodiment is the same as the resonator device 1 of the first embodiment except that an oscillation circuit 48 is formed in the base 4. In the following description, differences between the resonator device 1 of the third embodiment and the resonator device 1 of the first embodiment will be mainly described, and the same matters will not be described. In FIG. 20, the same configurations as the above embodiments are designated by the same reference signs.

In the resonator device 1 of the present embodiment, as illustrated in FIG. 20, the oscillation circuit 48 electrically coupled to the resonator element 5 is formed in the base 4. In the present embodiment, the lower surface 411 of the base substrate 41 is set as an active surface. In addition, a stack 49 in which an insulating layer 491 and an interconnect layer 492 are stacked is disposed on the lower surface 411 of the base substrate 41. A plurality of circuit elements (not illustrated) formed on the lower surface 411 are electrically coupled through the interconnect layer 492 and constitute the oscillation circuit 48. By forming the oscillation circuit 48 in the base 4, the space of the base 4 can be effectively used.

According to the third embodiment, the same effect as the first embodiment can be exhibited. In the present embodiment, the lower surface 411 of the base substrate 41 is set as the active surface. However, the present embodiment is not for limitation purposes. The upper surface 412 of the base substrate 41 may be set as the active surface. By setting the upper surface 412 of the base substrate 41 as the active surface, the resonator device and the oscillation circuit 48 can be electrically coupled at a low impedance. Thus, oscillation of the oscillation circuit 48 can be stabilized.

Fourth Embodiment

Figure 21:
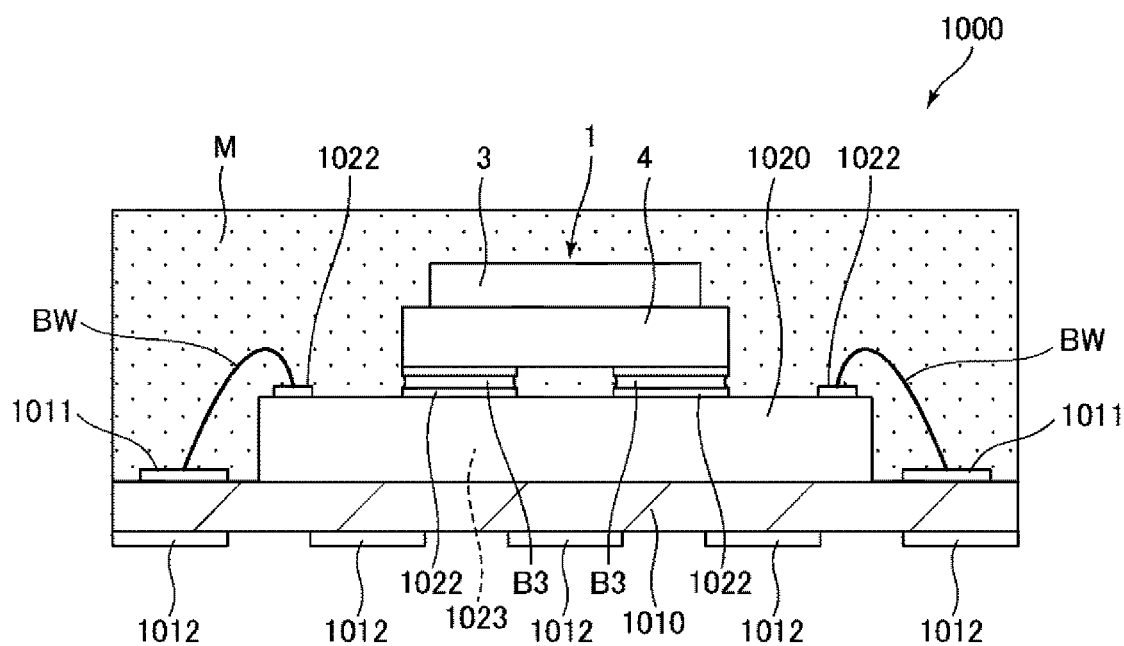
FIG. 21 is a sectional view illustrating a resonator module according to a fourth embodiment.

FIG. 21 is a sectional view illustrating a resonator module according to a fourth embodiment.

A resonator module 1000 illustrated in FIG. 21 includes a support substrate 1010, a circuit substrate 1020 mounted on the support substrate 1010, the resonator device 1 mounted on the circuit substrate 1020, and a mold material M molding the circuit substrate 1020 and the resonator device 1.

For example, the support substrate 1010 is an interposer substrate. A plurality of coupling terminals 1011 are arranged on the upper surface of the support substrate 1010. A plurality of mount terminals 1012 are arranged on the lower surface of the support substrate 1010. An internal interconnect, not illustrated, is arranged in the support substrate 1010. Each coupling terminal 1011 is electrically coupled to the corresponding mount terminal 1012 through the internal interconnect. The support substrate 1010 is not particularly limited. For example, a silicon substrate, a ceramic substrate, a resin substrate, a glass substrate, or a glass epoxy substrate can be used.

The circuit substrate 1020 is bonded to the upper surface of the support substrate 1010 through a die attaching material. In the circuit substrate 1020, an oscillation circuit 1023 that generates the frequency of a reference signal such as a clock signal by oscillating the resonator element 5 of the resonator device 1 is formed. A plurality of terminals 1022 electrically coupled to the oscillation circuit are arranged on the upper surface of the oscillation circuit 1023. A part of the terminals 1022 is electrically coupled to the coupling terminals 1011 through bonding wires BW. A part of the terminals 1022 are electrically coupled to the resonator device 1 through a conductive bonding member B3 such as solder.

The mold material M molds the circuit substrate 1020 and the resonator device 1 and protects the circuit substrate 1020 and the resonator device 1 from moisture, dust, shock, and the like. The mold material M is not particularly limited. For example, a thermosetting type epoxy resin can be used, and the molding can be performed using a transfer molding method.

The resonator module 1000 includes the resonator device 1. Thus, the effect of the resonator device 1 can be accomplished, and excellent reliability can be exhibited. Particularly, as described above, in the resonator device 1, the corners 39 of the side surface 38 of the lid 3 are rounded. Thus, the mold material M easily flows around the lid 3 during the molding. Thus, voids are unlikely to occur during the molding, and the resonator device 1 and the circuit substrate 1020 can be more securely protected from moisture and the like.

Fifth Embodiment

Figure 22:
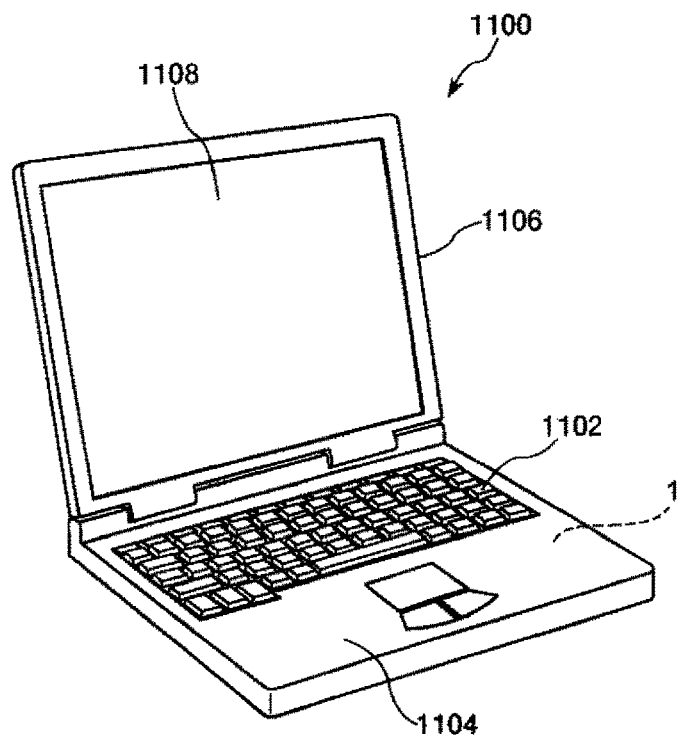
FIG. 22 is a perspective view illustrating an electronic apparatus according to a fifth embodiment.

FIG. 22 is a perspective view illustrating an electronic apparatus according to a fifth embodiment.

The electronic apparatus including the resonator device of the present application example is applied to a laptop type personal computer 1100 illustrated in FIG. 22. In FIG. 22, the personal computer 1100 is configured with a main body 1104 including a keyboard 1102, and a display unit 1106 including a display 1108. The display unit 1106 is pivotably supported with respect to the main body 1104 through a hinge structure. For example, the resonator device 1 used as an oscillator is incorporated in the personal computer 1100.

The personal computer 1100 as the electronic apparatus includes the resonator device 1. Thus, the effect of the resonator device 1 can be accomplished, and high reliability can be exhibited.

Sixth Embodiment

Figure 23:
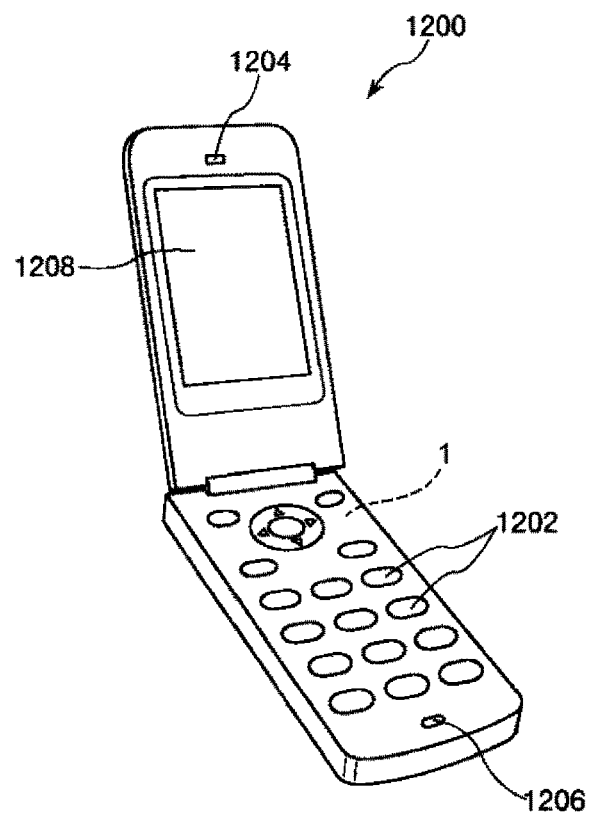
FIG. 23 is a perspective view illustrating an electronic apparatus according to a sixth embodiment.

FIG. 23 is a perspective view illustrating an electronic apparatus according to a sixth embodiment.

The electronic apparatus including the resonator device of the present application example is applied to a mobile phone 1200 illustrated in FIG. 23. The mobile phone 1200 includes an antenna, a plurality of operation buttons 1202, a receiver 1204, and a transmitter 1206. A display 1208 is arranged between the operation buttons 1202 and the receiver 1204. For example, the resonator device 1 used as an oscillator is incorporated in the mobile phone 1200.

The mobile phone 1200 as the electronic apparatus includes the resonator device 1. Thus, the effect of the resonator device 1 can be accomplished, and high reliability can be exhibited.

Seventh Embodiment

Figure 24:
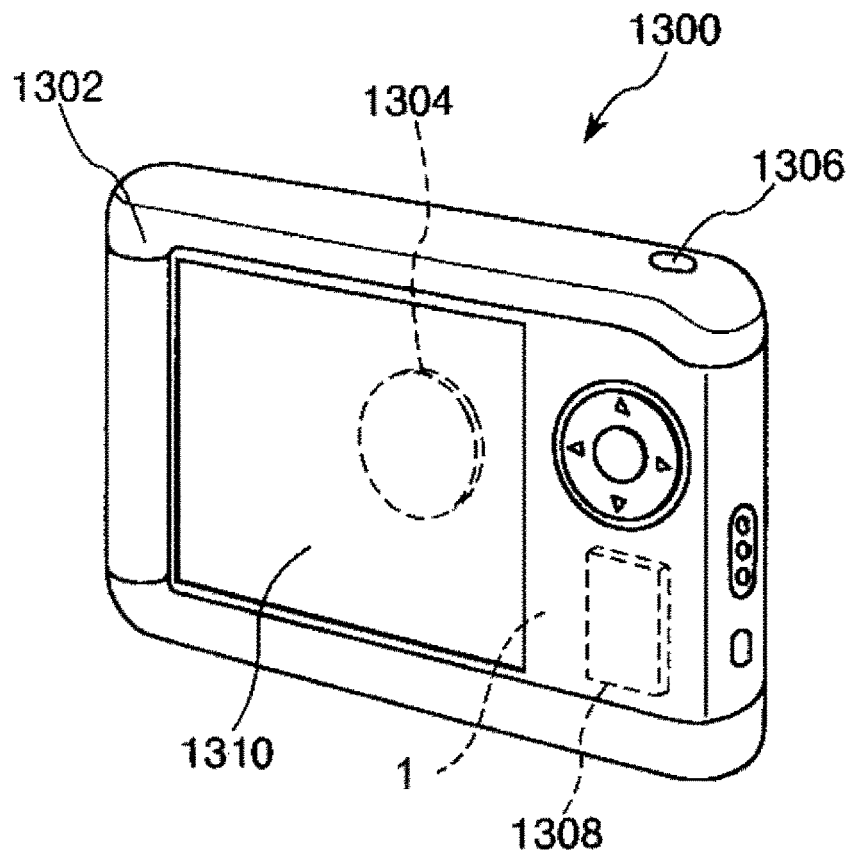
FIG. 24 is a perspective view illustrating an electronic apparatus according to a seventh embodiment.

FIG. 24 is a perspective view illustrating an electronic apparatus according to a seventh embodiment.

The electronic apparatus including the resonator device of the present application example is applied to a digital still camera 1300 illustrated in FIG. 24. A display 1310 is disposed on the rear surface of a body 1302 and is configured to perform displaying based on an imaging signal of a CCD. The display 1310 functions as a finder that displays a subject as an electronic image. A light receptor 1304 that includes an optical lens, a CCD, and the like is disposed on the front surface side (in FIG. 24, the rear surface side) of the body 1302. When a camera operator checks the subject image displayed on the display 1310 and presses a shutter button 1306, the imaging signal of the CCD at that time point is transferred to and stored in a memory 1308. For example, the resonator device 1 used as an oscillator is incorporated in the digital still camera 1300.

The digital still camera 1300 as the electronic apparatus includes the resonator device 1. Thus, the effect of the resonator device 1 can be accomplished, and high reliability can be exhibited.

In addition to the personal computer, the mobile phone, and the digital still camera, for example, the electronic apparatus of the present application example can be applied to a smartphone, a tablet terminal, a timepiece (including a smart watch), an ink jet type ejecting apparatus (for example, an ink jet printer), a laptop type personal computer, a television, a wearable terminal such as a head-mounted display (HMD), a video camera, a video tape recorder, a car navigation apparatus, a pager, an electronic organizer (including an electronic organizer having a communication function), an electronic dictionary, an electronic calculator, an electronic game apparatus, a word processor, a workstation, a videophone, a security television monitor, an electronic binocular, a POS terminal, a medical apparatus (for example, an electronic thermometer, a blood pressure meter, a blood glucose meter, an electrocardiograph, an ultrasound diagnosis apparatus, and an electronic endoscope), a fishfinder, various measuring apparatuses, a mobile terminal base station apparatus, meters (for examples, meters of a vehicle, an aircraft, and a ship), a flight simulator, a network server, and the like.

Eighth Embodiment

Figure 25:
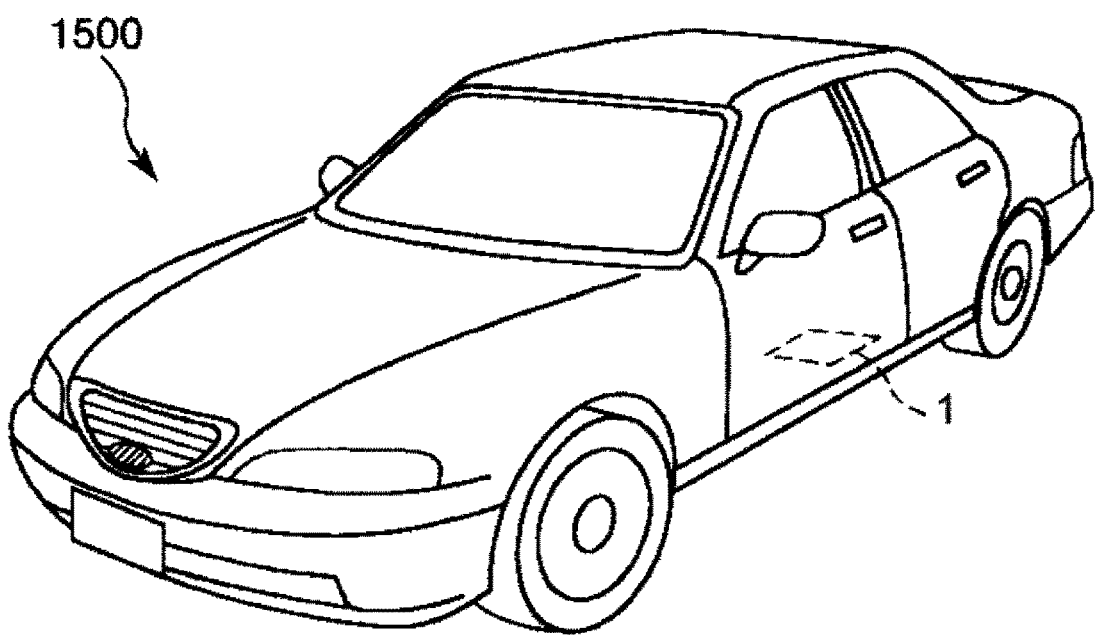
FIG. 25 is a perspective view illustrating a vehicle according to an eighth embodiment.

FIG. 25 is a perspective view illustrating a vehicle according to an eighth embodiment.

An automobile 1500 illustrated in FIG. 25 is an automobile to which the vehicle including the resonator device of the present application example is applied. For example, the resonator device 1 used as an oscillator is incorporated in the automobile 1500. The resonator device 1 can be widely applied to keyless entry, an immobilizer, a car navigation system, a car air conditioner, an antilock brake system (ABS), an airbag, a tire pressure monitoring system (TPMS), engine control, a battery monitor of a hybrid automobile or an electric automobile, and an electronic control unit (ECU) such as a vehicle attitude control system.

The automobile 1500 as the vehicle includes the resonator device 1. Thus, the effect of the resonator device 1 can be accomplished, and high reliability can be exhibited.

The vehicle is not limited to the automobile 1500 and can be applied to an airplane, a ship, an automatic guided vehicle (AGV), a biped robot, an unmanned airplane such as a drone, and the like.

While the resonator device, the resonator module, the electronic apparatus, and the vehicle according to the present application example are described thus far based on the illustrated embodiments, the present application example is not limited to the embodiments. The configuration of each unit can be replaced with any configuration having the same function. Any other constituents may be added to the present application example. The present application example may be a combination of any two or more configurations in each of the embodiments.

What is claimed is:

1. A resonator device comprising:
   a base;
   a resonator element attached to the base;
   a cover accommodating the resonator element between the base and the cover; and
   a bonding member that is positioned between the base and the cover and that bonds the base to the cover, wherein the base includes
      a resonator element mount surface on which the resonator element is attached,
      a first interconnect and a second interconnect that are arranged on the resonator element mount surface and that are electrically coupled to the resonator element,
      a bonding surface bonded to the cover through the bonding member, and
      a step between the resonator element mount surface and the bonding surface.

2. The resonator device according to claim 1, wherein the base includes
   a base substrate including a first surface, and
   an insulating layer that is arranged on the first surface of the base substrate and that includes a second surface at a side opposite to the base substrate, wherein
   the bonding surface is included in the first surface, and
   the resonator element mount surface is included in the second surface.

3. The resonator device according to claim 1, wherein the base includes
   a base substrate including a first surface,
   a first insulating layer that is arranged on the first surface of the base substrate and that includes a second surface at a side opposite to the base substrate, and
   a second insulating layer that is arranged on the first surface of the base substrate to surround the first insulating layer and to be spaced apart from the first insulating layer and that includes a third surface at a side opposite to the base substrate, wherein the resonator element mount surface is included in the second surface, and the bonding surface is included in the third surface.

4. The resonator device according to claim 1, wherein in plan view along a line normal to the resonator element mount surface, each of the first interconnect and the second interconnect overlaps with the resonator element.

5. The resonator device according to claim 1, wherein $t1 \geq 10 \times t2$, where t1 is a height of the step and t2 is a thickness of the bonding member.

6. The resonator device according to claim 5, wherein $t1 \geq 100$ nm.

7. The resonator device according to claim 1, wherein the base substrate is a semiconductor substrate.

8. A resonator module comprising:

the resonator device according to claim 1; and an oscillation circuit oscillating the resonator element.

9. An electronic apparatus comprising:

the resonator device according to claim 1.

10. A vehicle comprising:

the resonator device according to claim 1.

\* \* \* \* \*